United States Patent
Imai (10) Patent No.: US 6,737,667 B1
(45) Date of Patent: May 18, 2004

(54) IMAGE RECORDING MEDIUM, IMAGE RETRIEVING METHOD AND IMAGE RETRIEVING APPARATUS

(75) Inventor: Shinji Imai, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/152,980

(22) Filed: May 23, 2002

(30) Foreign Application Priority Data

May 24, 2001 (JP) .................................. 2001/154878

(51) Int. Cl.[7] .................................................. G01T 1/16
(52) U.S. Cl. ........................ 250/591; 250/590; 430/57.8
(58) Field of Search ................................ 250/591, 590, 250/580, 581, 585, 586, 370.01, 370.08, 370.09, 370.11, 370.12, 484.2; 257/431; 378/25, 31; 347/122; 358/400; 369/661; 430/57.8

(56) References Cited

U.S. PATENT DOCUMENTS

| | | | |
|---|---|---|---|
| 4,535,468 A | | 8/1985 | Kempter |
| 5,492,783 A | * | 2/1996 | Utsumi et al. ............. 430/48 |
| 5,718,996 A | * | 2/1998 | Iijima et al. ............. 430/56 |
| 6,268,614 B1 | | 7/2001 | Imai |
| 6,376,857 B1 | | 4/2002 | Imai |
| 6,455,867 B2 | * | 9/2002 | Ogawa ................. 250/580 |
| 6,552,356 B2 | * | 4/2003 | Imai ..................... 250/580 |
| 6,590,224 B2 | * | 7/2003 | Imai ..................... 250/591 |
| 6,617,604 B2 | * | 9/2003 | Imai ..................... 250/591 |
| 2001/0048085 A1 | * | 12/2001 | Shoji .................... 250/585 |
| 2002/0168198 A1 | * | 11/2002 | Imai ..................... 399/153 |
| 2003/0010942 A1 | * | 1/2003 | Kuwabara ............... 250/580 |

FOREIGN PATENT DOCUMENTS

| | | |
|---|---|---|
| JP | 10-271374 | 10/1998 |
| JP | 2000-105297 | 4/2000 |

* cited by examiner

*Primary Examiner*—Constantine Hannaher
*Assistant Examiner*—Otilia Gabor
(74) *Attorney, Agent, or Firm*—Sughrue Mion, PLLC (57) ABSTRACT

In an image recording medium, in which a size of a first electrode layer is smaller than a recording photoconductive layer, image quality is enhanced by preventing an influence of corona discharge at an end portion of the first electrode layer and electric charge injection into the recording photoconductive layer.

The on and off state of the retrieving light irradiating means is controlled in a manner that an electromagnetic wave for retrieval is not irradiated onto end portions of a non-imaging region of a retrieving photoconductive layer corresponding to a peripheral portion on an upper surface of the recording photoconductive layer where the first electrode layer is not provided, thus avoiding retrieval of a false image signal attributable to corona discharge at the end portion of the first electrode layer and electric charge injection from the end portion of the first electrode layer into the recording photoconductive layer.

12 Claims, 6 Drawing Sheets

X-Z CROSS SECTION

FIG.2C

X-Y CROSS SECTION

IMAGE RECORDING MEDIUM, IMAGE RETRIEVING METHOD AND IMAGE RETRIEVING APPARATUS

BACKGROUND OF THE INVENTION

1. Field of the Invention

The present invention relates to an image recording medium including an electric accumulator that accumulates electric charges in a quantity corresponding to an electromagnetic wave irradiated for recording as electric charges for a latent image. The present invention also relates to an image retrieving method and an image retrieving apparatus to retrieve an electrostatic latent image recorded on the image recording medium.

2. Description of the Related Art

A conventionally-known method for use in medical radiography or the like is a method utilizing, for example, a radiation image recording medium (an electrostatic recorder) as a photoreceptor. The radiation image recording medium, which includes a photoconductor such as a selenium plate sensitive to radiations such as X-rays, is used as an image recording medium having an electric accumulator for accumulating electric charges in a quantity corresponding to irradiated electromagnetic waves for recording as electric charges for a latent image. In the foregoing method, X-rays are irradiated onto the radiation image recording medium to allow the electric charges in a quantity corresponding to the irradiated radiation to be accumulated in the electric accumulator inside the radiation image recording medium, whereby radiation image information is recorded as an electrostatic latent image. Moreover, the radiation image information is retrieved out of the radiation image recording medium by scanning the radiation image recording medium, on which the radiation image information is recorded, with a laser beam or a line light source (as disclosed in U.S. Pat. No. 4,535,468, for example). It is possible to attempt reduction of radiation dosage of a test subject and enhancement in diagnostic performance by use of the radiation image recording medium.

In Japanese Unexamined Patent Publication No. 2000-105297 and in Japanese Patent Application No. 10 (1998)-271374, there has already been disclosed a radiation image recording medium which is capable of combining high-speed response upon reading out and efficient extraction of signal charges, a recording apparatus for recording radiation image information on this radiation image recording medium, and an image retrieving method and an image retrieving apparatus for retrieving the radiation image information out of the radiation image recording medium, on which the radiation image information is recorded as the electrostatic latent image.

The method disclosed in Japanese Unexamined Patent Publication No. 2000-105297 includes the steps of using a radiation image recording medium including a first electrode layer which transmits radiation for recording or light emitted by excitation of the radiation, a recording photoconductive layer which takes on conductivity by receiving irradiation of the radiation for recording or the light, a charge transport layer which acts substantially as an insulator with respect to electric charges for a latent image and acts substantially as a conductor with respect to transported electric charges having a reverse polarity to the electric charges for a latent image, a retrieving photoconductive layer which takes on conductivity by receiving irradiation of an electromagnetic wave for retrieval, and a second electrode layer which transmits the electromagnetic wave for retrieval, the radiation image recording medium in which the foregoing constituents are stacked in accordance with the above order of enumeration, irradiating the radiation for recording onto the first electrode layer of the radiation image recording medium, recording radiation image information as an electrostatic latent image by allowing electric charges in a quantity corresponding to the dosage of the irradiated radiation to be accumulated in an electric accumulator formed substantially at an interface between the recording photoconductive layer and the charge transport layer, and obtaining the radiation image information by reading the recorded electrostatic latent image by irradiation of the electromagnetic wave for retrieval.

In addition, there has also been disclosed a radiation image recording medium, in which the second electrode layer is a stripe electrode composed of multiple line electrodes arranged in a stripe configuration which transmit the electromagnetic wave for retrieval. The foregoing radiation image recording medium can accumulate the electric charges for a latent image intensively in the electric accumulators corresponding to the respective line electrodes of the stripe electrode. Accordingly, it is possible to enhance sharpness of an image.

In the foregoing radiation image recording medium, if a direct-current voltage is applied such that the first electrode layer is charged as negative electric potential and the second electrode layer is charged as positive electric potential, and if the radiation which passed through an imaging object is irradiated onto the first electrode layer of the above-described radiation image recording medium, then charge pairs are generated on the recording photoconductive layer as corresponding to the dosage of the radiation owing to irradiation of the radiation that passed through the first electrode layer. Accordingly, negative electric charges are accumulated in the electric accumulator as the electric charges for a latent image, and the radiation image is recorded as the electrostatic latent image.

Moreover, if application of the direct-current voltage is discontinued and re-arrangement of electric charges are performed by short-circuiting the first electrode layer and the second electrode layer, and if the electromagnetic wave for retrieval is subsequently irradiated onto the second electrode layer of the radiation image recording medium, then the electromagnetic wave is transmitted through the second electrode layer and irradiated onto a retrieving photoconductive layer, whereby charge pairs are generated in the retrieving photoconductive layer. Among those charge pairs, positive electric charges are transmitted through the charge transport layer and coupled with negative electric charges accumulated in the electric accumulator. Meanwhile, negative electric charges cause electric discharge owing to re-coupling with positive electric charges that are charged on the second electrode layer. Retrieval of the electrostatic latent image is performed by detecting voltage variation generated between the first electrode layer and the second electrode layer owing to the electric discharge, as current variation with a current detection amplifier or the like.

Now, in the above-described radiation image recording medium, if a method such as vacuum deposition is used as a method for providing the first electrode layer on a surface of the recording photoconductive layer, such deposition of an electrode material takes place in a state that the radiation image recording medium is supported via a peripheral portion of the recording photoconductive Layer while the surface of the recording photoconductive layer is facing downward. Accordingly, an area of the first electrode layer to be provided becomes smaller than an area of the recording photoconductive layer by an area equivalent to an area of the peripheral portion. Even if the first electrode layer is provided by use of other fabricating methods, it is still difficult to form the first electrode layer exactly in the same area as the recording photoconductive layer. As a result, a small area without provision of the first electrode layer is incurred on the peripheral portion of the upper surface of the recording photoconductive layer. Meanwhile, if the first electrode layer is provided in the exactly same area as the recording photoconductive layer, then electric discharge against the second electrode layer tends to increase. Therefore, there may be a case that provision of the first electrode layer in a smaller area than the recording photoconductive layer as described above is rather preferred.

However, if the size of the first electrode layer is smaller than the size of the recording photoconductive layer as described above, corona discharge occurs at an end portion of the first electrode layer when a direct-current voltage is applied between the first electrode layer and the second electrode layer upon recording a radiation image. As a result, negative electric charges generated by this discharge are charged on a surface of the peripheral portion of the recording photoconductive layer where the first electrode layer is not provided. The negative electric charges leaking out of the end portion of the first electrode layer are injected into the recording photoconductive layer. Furthermore, the injected negative electric charges are accumulated in the electric accumulator after passing through the recording photoconductive layer. Thereafter, the negative electric charges charged on the surface of the peripheral portion owing to the above-described corona discharge and the negative electric charges accumulated in the electric accumulator owing to injection of the electric charges collectively form electric field distribution between the second electrode layer and the negative charges themselves. Such an electric field distribution will not be deleted but retained even after short-circuiting the first electrode layer and the second electrode layer upon the above-described retrieval. In other words, a virtual image is recorded with respect to the above-described peripheral portion even where the image is not supposed to be recorded originally.

Meanwhile, in the above-mentioned radiation image retrieving apparatus, an electromagnetic wave for retrieval is irradiated linearly in a main scanning direction with a line light source, for example, and then irradiated two-dimensionally over the entire surface of the second electrode layer by scanning in a sub-scanning direction. Alternatively, a beam electromagnetic wave is irradiated by scanning in the main scanning direction and the sub-scanning direction, whereby the electromagnetic wave is irradiated two-dimensionally over the entire surface of the second electrode layer. Therefore, when the electromagnetic wave for retrieval is irradiated onto the entire surface of the second electrode layer as described above, the electromagnetic wave for retrieval is also irradiated onto a region of the second electrode layer corresponding to the above-described peripheral portion (a non-imaging portion). Accordingly, charge pairs which are generated in the retrieving photoconductive layer are discharged attributable to the electric field distribution, and such discharge generates a large false image signal. Since such a false image signal is intense, the false image signal affects an image signal to be retrieved from an imaging region, thus causing deterioration of image quality. Moreover, since a false image signal attributable to the negative electric charges charged on the surface of the peripheral portion by the corona discharge has a particularly intense time constant, such a false image signal greatly affects the image signal to be retrieved from the imaging region. In addition, it is impossible to remove the false image signals mixed in the image signal upon retrieval from the imaging region as described above by subsequent image processing or the like.

SUMMARY OF THE INVENTION

In consideration of the foregoing problem, an object of the present invention is to provide an image recording medium, an image retrieving method and an image retrieving apparatus capable of enhancing image quality of an image without generating the false image signal as described above even in the case where the size of the first electrode layer of the image recording medium is smaller than the size of the recording photoconductive layer as described above.

An image recording medium according to the present invention concerns an image recording medium including a first electrode layer which transmits an electromagnetic wave for recording, a recording photoconductive layer which takes on conductivity by receiving irradiation of the electromagnetic wave for recording, an electric accumulator which accumulates electric charges for a latent image generated on the recording photoconductive layer, a retrieving photoconductive layer which takes on conductivity by receiving irradiation of an electromagnetic wave for retrieval, and a second electrode layer which transmits the electromagnetic wave for retrieval, the image recording medium being formed by stacking the foregoing constituents in accordance with the above order of enumeration. Here, the image recording medium is characterized in that a size of the first electrode layer is smaller than the recording photoconductive layer and the recording photoconductive layer thereby includes a peripheral portion on an upper surface thereof on which the first electrode layer is not provided, and a light-shielding film is provided for shielding irradiation of the electromagnetic wave for retrieval onto a non-imaging region of the retrieving photoconductive layer corresponding to the peripheral portion.

Here, the foregoing aspect that the "size of the first electrode layer is smaller than the recording photoconductive layer" refers to an aspect that the size of the first electrode layer is smaller than the recording photoconductive layer from a viewpoint of a stacking direction (a direction indicated by an arrow S in FIG. 1) of the respective layers of the image recording medium.

Moreover, the foregoing "non-imaging region of the retrieving photoconductive layer corresponding to the peripheral portion" refers to a region of the retrieving photoconductive layer in the same range as the peripheral portion from the viewpoint of the stacking direction of the image recording medium.

Furthermore, the foregoing "shielding irradiation of the electromagnetic wave for retrieval onto a non-imaging region" refers to an action of shielding the non-imaging region from irradiation of the electromagnetic wave for retrieval either entirely or partially.

Furthermore, the foregoing "light-shielding film" may be provided anywhere so far as the light-shielding film can shield the non-imaging region of the retrieving photoconductive layer from irradiation of the electromagnetic wave for retrieval. For example, the light-shielding film may be disposed on a face of the retrieving photoconductive layer corresponding to the non-imaging region where the electromagnetic wave for retrieval is irradiated, a surface of the second electrode layer corresponding to the non-imaging region, a surface of a predetermined support corresponding to the non-imaging region if the image recording medium is disposed on the support, or the like.

Furthermore, the image recording medium can be designed in a manner that the electromagnetic wave for retrieval is irradiated onto the second electrode layer two-dimensionally by scanning in a main scanning direction and in a sub-scanning direction, and the light-shielding film can be designed to shield at least one of the end regions, which are located at both end portions of the non-imaging portion in the sub-scanning direction, from irradiation of the electromagnetic wave for retrieval.

Here, if the electromagnetic wave for retrieval is irradiated from a line light source onto the image recording medium, for example, then the foregoing "main scanning direction" refers to a longitudinal direction of the line light source, and a direction approximately orthogonal to the longitudinal direction is referred to as the "sub-scanning direction". Meanwhile, if the electromagnetic wave for retrieval is irradiated onto the image recording medium by scanning with beam light, then the foregoing "main scanning direction" refers to a direction in which the beam light is linearly irradiated and a direction approximately orthogonal to the direction of such linear irradiation is referred to as the "sub-scanning direction".

Moreover, the light-shielding film can be also designed to shield irradiation of the electromagnetic wave for retrieval onto an edge portion of an imaging region adjacent to the non-imaging region shielded from irradiation of the electromagnetic wave for retrieval.

Here, the foregoing "imaging region" refers to a range of the retrieving photoconductive layer in the same range as the first electrode layer from a view point of the stacking direction of the image recording medium.

Moreover, it is preferable that the foregoing "end portion of the imaging region" is a region within the imaging region where the image therein is less important or a region which is a margin of the image.

An image retrieving method according to the present invention concerns an image retrieving method using an image recording medium, which includes a first electrode layer which transmits an electromagnetic wave for recording, a recording photoconductive layer which takes on conductivity by receiving irradiation of the electromagnetic wave for recording, an electric accumulator which accumulates electric charges for a latent image generated on the recording photoconductive layer, a retrieving photoconductive layer which takes on conductivity by receiving irradiation of an electromagnetic wave for retrieval, and a second electrode layer which transmits the electromagnetic wave for retrieval, the image recording medium being formed by stacking the foregoing constituents in accordance with the above order of enumeration. The image retrieving method performs retrieval by irradiating the electromagnetic wave for retrieval two-dimensionally by scanning in a main scanning direction and in a sub-scanning direction with respect to the second electrode layer of the image recording medium in which the electric charges for a latent image are accumulated into the electric accumulator thereof by irradiation of the electromagnetic wave for recording, and by obtaining an electric signal at a level corresponding to a quantity of the electric charges for a latent image which are accumulated in the electric accumulator by the irradiation. Here, the image retrieving method is characterized in that a size of the first electrode layer of the image recording medium is smaller than the recording photoconductive layer thereof and the recording photoconductive layer thereby includes a peripheral portion on an upper surface thereof on which the first electrode layer is not provided, and the electromagnetic wave for retrieval is not irradiated onto a non-imaging region of the second electrode layer corresponding to the peripheral portion.

Here, the foregoing "non-imaging region of the second electrode layer corresponding to the peripheral portion" refers to a region of the second electrode layer in the same range as the peripheral portion from a viewpoint of a stacking direction of the image recording medium.

Moreover, as for the foregoing method in which "the electromagnetic wave for retrieval is not irradiated", for example, a power source of a light source or the like, which generates the electromagnetic wave for retrieval, may be turned off not to generate the electromagnetic wave for retrieval. Alternatively, the electromagnetic wave for retrieval may be shielded by a predetermined light-shielding member or the like. Moreover, the method may be carried out in a manner not to irradiate the entirety of the non-imaging region or not to irradiate a part of the non-imaging region.

Moreover, the method can be designed not to irradiate the electromagnetic wave for retrieval onto at least one of the end regions located at both end portions of the non-imaging portion in the sub-scanning direction.

Furthermore, the method can be also designed not to irradiate the electromagnetic wave for retrieval onto an edge portion of an imaging region adjacent to the non-imaging region on which the electromagnetic wave for retrieval is not irradiated.

An image retrieving apparatus according to the present invention concerns an image retrieving apparatus which includes: an image recording medium including a first electrode layer which transmits an electromagnetic wave for recording, a recording photoconductive layer which takes on conductivity by receiving irradiation of the electromagnetic wave for recording, an electric accumulator which accumulates electric charges for a latent image generated on the recording photoconductive layer, a retrieving photoconductive layer which takes on conductivity by receiving irradiation of an electromagnetic wave for retrieval, and a second electrode layer which transmits the electromagnetic wave for retrieval, the image recording medium being formed by stacking the foregoing constituents in accordance with the above order of enumeration; retrieving light irradiating means for irradiating an electromagnetic wave for retrieval two-dimensionally by scanning in a main scanning direction and in a sub-scanning direction with respect to the second electrode layer of the image recording medium in which the electric charges for a latent image are accumulated in the electronic accumulator thereof by irradiation of the electromagnetic wave for recording; and image signal obtaining means for obtaining an electric signal at a level corresponding to a quantity of the electric charges for a latent image which are accumulated in the electric accumulator owing to irradiation of the electromagnetic wave for retrieval by the retrieving light irradiating means. Here, the image retrieving apparatus is characterized in that a size of the first electrode layer of the image recording medium is smaller than the recording photoconductive layer thereof and the recording photoconductive layer thereby includes a peripheral portion on an upper surface thereof on which the first electrode layer is not provided, and the retrieving light irradiating means does not irradiate the electromagnetic wave for retrieval onto a non-imaging region of the second electrode layer corresponding to the peripheral portion.

Moreover, the retrieving light irradiating means can be designed to include a light-shielding member for shielding the electromagnetic wave for retrieval, and the electromagnetic wave for retrieval is not irradiated onto the non-imaging region by use of the light-shielding member.

Moreover, the retrieving light irradiating means can be designed not to irradiate the electromagnetic wave for retrieval onto at least one of the end regions located at both end portions of the non-imaging portion in the sub-scanning direction.

Furthermore, the retrieving light irradiating means can be designed to include a light-shielding member for shielding the electromagnetic waver for retrieval, and the retrieving light irradiating means can be designed not to irradiate the electromagnetic wave for retrieval onto at least one of end regions located at both end portions of the non-imaging portion in the sub-scanning direction by use of the light-shielding member.

Furthermore, the retrieving light irradiating means can be also designed not to irradiate the electromagnetic wave for retrieval onto an edge portion of an imaging region adjacent to the non-imaging region on which the electromagnetic wave for retrieval is not irradiated.

Furthermore, the retrieving light irradiating means can be also designed not to irradiate the electromagnetic wave for retrieval onto an edge portion of an imaging region adjacent to the non-imaging region on which the electromagnetic wave for retrieval is not irradiated by use of a light-shielding member.

In addition, the image recording medium may further include other layers in addition to the above-described layers.

According to the image recording medium, the image retrieving method and the image retrieving apparatus of the present invention, the electromagnetic wave for retrieval is not irradiated onto the non-imaging region of the retrieving photoconductive layer corresponding to the peripheral portion where the first electrode layer is not provided on the upper surface of the recording photoconductive layer. Therefore, it is possible to avoid retrieval of a false image signal, which is attributable to corona discharge at an end portion of the first electrode layer and injection of electric charges from the end portion of the first electrode layer into the recording photoconductive layer, whereby a deterioration of an S/N ratio of the image signal under an adverse influence of the false image signal can be prevented and image quality can be thereby enhanced.

Moreover, if the electromagnetic wave for retrieval is arranged not to be irradiated onto at least one of the end regions located at both end portions of the non-imaging region in the sub-scanning direction, then it is possible to avoid retrieval of a false image signal corresponding to the end region of the non-imaging region immediately before scanning the imaging region when the false image signal is particularly apt to affect the image signal. Accordingly, it is possible to attempt further enhancement in image quality.

Moreover, if the electromagnetic wave for retrieval is also arranged not to be irradiated onto the edge region of the imaging region adjacent to the non-imaging region on which the electromagnetic wave for retrieval is not irradiated, then it is possible to avoid the adverse influence by the false image signal more sufficiently.

Furthermore, according to the image recording medium of the present invention, the electromagnetic wave for retrieval is shielded by the light-shielding film. Therefore, the above-mentioned effects are obtainable with a simple constitution.

Furthermore, according to the image retrieving apparatus of the present invention, if the electromagnetic wave for retrieval is arranged not to be irradiated by use of a predetermined light-shielding member, then the above-mentioned effects are obtainable with a simple constitution of the apparatus.

DESCRIPTION OF THE PREFERRED EMBODIMENTS

Figure 1:
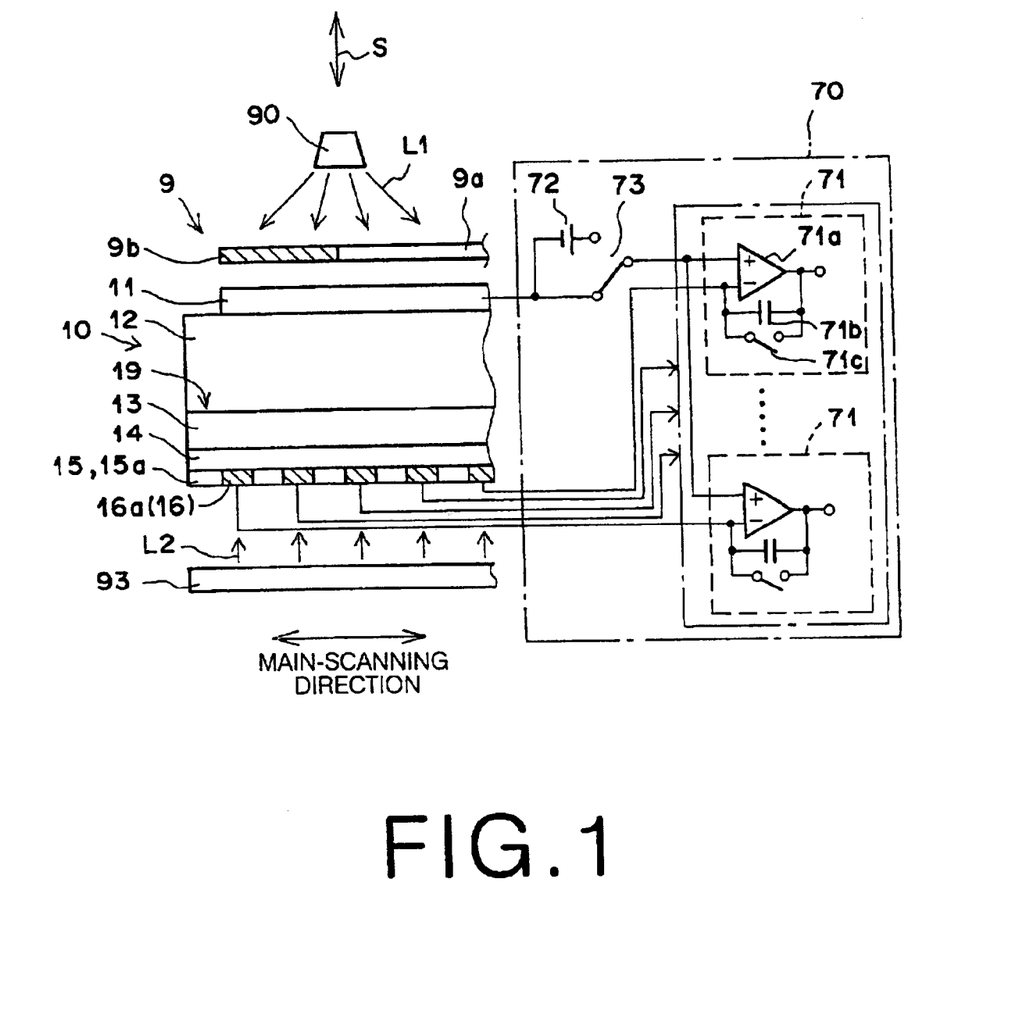
FIG. 1 is a schematic constitutional view of a radiation image recording and retrieving apparatus adopting a specific embodiment of an image retrieving apparatus according to the present invention.
Figure 2A:
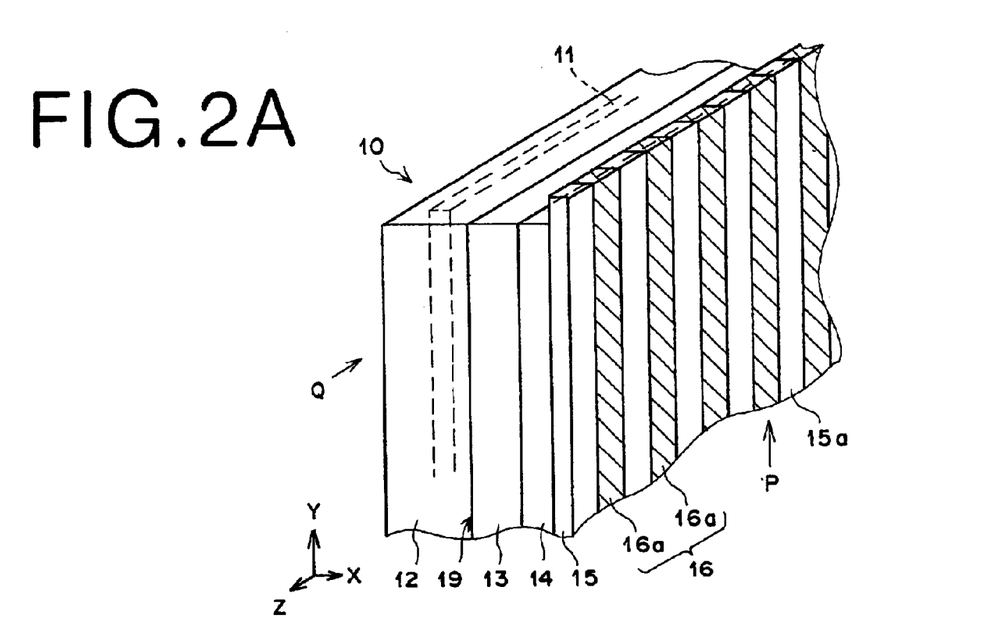
FIG. 2A is a perspective view of a radiation image recording medium for use in the radiation image recording and retrieving apparatus shown in FIG. 1.
Figures 2B, 2C:
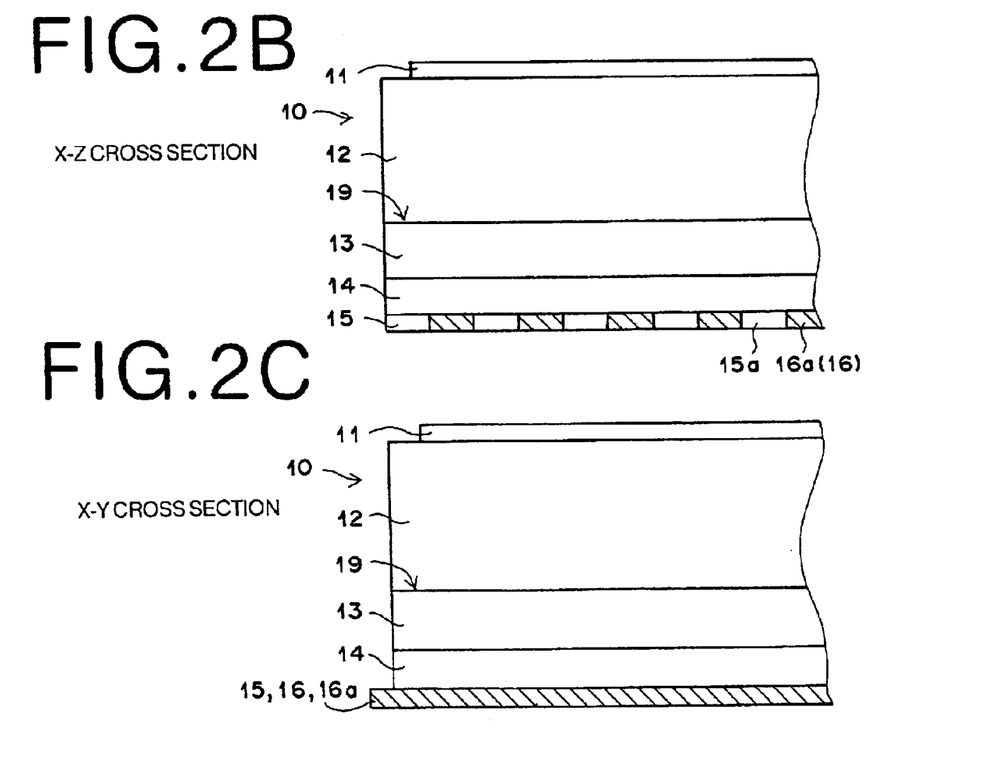
FIG. 2B is a cross-sectional view of an X-Z plane of the radiation image recording medium of FIG. 2A in a position indicated by an arrow Q.
FIG. 2C is a cross-sectional view of an X-Y plane of the radiation image recording medium of FIG. 2A in a position indicated by an arrow P.

Now, description will be made regarding the preferred embodiments of the present invention with reference to the accompanying drawings. FIG. 1 is a view showing a schematic constitution of a first embodiment of a radiation image recording and retrieving apparatus which adopts an image retrieving apparatus to embody an image retrieving method of the present invention, and FIGS. 2A to 2C are views showing a schematic constitution of a radiation image recording medium used in this embodiment. Specifically, FIG. 2A is a perspective view thereof, FIG. 2B is a cross-sectional view of an X-Z plane thereof in a position indicated by an arrow Q, and FIG. 2C is a cross-sectional view of an X-Y plane thereof in a position indicated by an arrow P. This radiation image recording medium 10 includes: a first electrode layer 11 which transmits an electromagnetic wave for recording (for example, radiation such as X-rays; hereinafter referred to as "recording light") L1; a recording photoconductive layer 12 which takes on conductivity by receiving irradiation of the recording light L1 transmitted through the first electrode layer 11; a charge transfer layer 13 acting substantially as an insulator with respect to electric charges for a latent image (negative electric charges, for example) and acting substantially as a conductor with respect to transported charges (positive electric charges according to the foregoing example) of the reverse polarity to the electric charges for a latent image; a retrieving photoconductive layer 14 which takes on conductivity by receiving irradiation of an electromagnetic wave for retrieval (hereinafter referred to as "retrieving light") L2; and a second electrode layer 15 which transmits the retrieving light L2. The radiation image recording medium 10 is formed by stacking the foregoing constituents in accordance with the above order of enumeration.

As shown in FIGS. 2A through 2C, in the radiation image recording medium 10 used in the embodiment, a size of the first electrode layer 11 is smaller than a size of the recording photoconductive layer 12. Note that the radiation image recording medium 10 is formed on a support which transmits the retrieving light L2 serially in an order starting from the second electrode layer 15; however, illustration of the support is omitted in the figures.

A material suitable for the recording photoconductive layer 12 is a photoconductive material including at least any one of amorphous selenium (a-Se), lead (II) oxide or lead (II) iodide such as PbO or $PbI_2$, $Bi_{12}$ (Ge, Si) $O_{20}$, $Bi_2I_3$/organic polymer nanocomposite and the like, as a chief component thereof.

As a material for the charge transport layer 13, it is preferable that the material has a difference between mobility of the negative electric charges, for example, to be charged in the first electrode layer 11 and mobility of the positive electric charges of the reverse polarity as large as possible (such as $10^2$ or larger, preferably $10^3$ or larger). Materials suitable for the charge transport layer 13 include organic compounds such as poly(N-vinylcarbazole) (PVK), N,N'-diphenyl-N,N'-bis(3-methylphenyl)-(1,1'-biphenyl)-4,4'-diamine (TPD) and discotic liquid crystal, TPD polymer (polycarbonate, polystyrene, PVK) dispersions, or semiconductor materials such as a-Se doped with 10 to 200 ppm of Cl. In particular, the organic compounds (PVK, TPD, discotic liquid crystal and the like) are preferred because they possess light insensitivity. In addition, since the organic compounds generally possess small permittivity, it is possible to reduce capacities of the charge transport layer 13 and the retrieving photoconductive layer 14, thus enhancing signal extraction efficiency upon retrieval. Note that the foregoing "possess light insensitivity" refers to a phenomenon wherein the organic compounds take on very little conductivity upon receiving irradiation of the recording light L1 or the retrieving light L2.

A material suitable for the retrieving photoconductive layer 14 is a photoconductive material including at least any one of a-Se, Se-Te, Se-As-Te, nonmetal phthalocyanine, metal phthalocyanine, magnesium phthalocyanine (MgPc), phase II of vanadyl phthalocyanine (VoPc) and copper phthalocyanine (CuPc), as a chief component thereof.

A thickness of the recording photoconductive layer 12 is preferably set in a range from 50 $\mu$m to 1000 $\mu$m inclusive in order to absorb the recording light L1 sufficiently. In this example, the thickness is set to about 500 $\mu$m. Meanwhile, an aggregate thickness of the charge transport layer 13 and the retrieving photoconductive layer 14 is preferably set to ½ or less than the thickness of the recording photoconductive layer 12. Since responses upon retrieval are enhanced as the foregoing aggregate thickness becomes thinner, the aggregate thickness is preferably set to 1/10 or less, more preferably to 1/20 or less, and so on.

A material suitable for the first electrode layer 11 and the second electrode layer 15 includes, for example, a NESA film which is a conductive material coated on a transparent glass plate.

An electrode in the second electrode layer 15 is formed as a stripe electrode 16 in which multiple elements (line electrodes) 16a are arranged in a stripe. A space 15a between the elements 16a is filled with a high-polymer material such as polyethylene with a small amount of pigment such as carbon black being dispersed therein, for example. The high-polymer material is supposed to possess a light shielding effect against the retrieving light L2.

Next, description will be made regarding the radiation image recording and retrieving apparatus of the present embodiment. FIG. 1 is a view showing a schematic constitution of the radiation image recording and retrieving apparatus of the present embodiment, which consists of an X-Z cross-sectional view of the radiation image recording medium 10 and a detail view of a current detection circuit 70.

The radiation image recording and retrieving apparatus of the present embodiment includes the radiation image recording medium 10, the current detection circuit 70 as image signal obtaining means, recording light irradiating means 90, and retrieving light irradiating means 93.

An imaging object 9 is disposed on an upper surface of the first electrode layer 11. The imaging object 9 includes a portion 9a which transmits the recording light L1 and a shielding portion (a light-shielding portion) 9b which does not transmit the recording light L1. The recording light irradiating means 90 is designed to irradiate the recording light L1 uniformly onto the imaging object 9.

The retrieving light irradiating means 93 is designed to scan-expose the substantially uniform retrieving light L2 linearly in the direction substantially orthogonal to the longitudinal direction of the respective elements 16a of the stripe electrode 16. In the event of scanning exposure, either continuous light or pulse light may be irradiated.

The current detection circuit 70 is designed for obtaining an image signal at a level corresponding to a quantity of the electric charges for a latent image accumulated in the electric accumulator 19. The current detection circuit 70, includes multiple current detection amplifiers 71 connected to each of the elements 16a of the stripe electrode 16. The current detection amplifier 71 is composed of an operating amplifier 71a, an integrating capacitor 71b and a switch 71c. The first electrode layer 11 of the radiation image recording medium 10 is connected to one end of a switch 73 and to the negative pole of a power source 72. The positive pole of the power source 72 is connected to the other end of the switch 73. Noninverting input terminals (+) of the respective operating amplifiers 71a are connected to one end of the switch 73 in common, and inverting input terminals (−) thereof are connected to each of the elements 16a.

The switch 73 is connected to the power source 72 in the event of recording, whereby a predetermined direct-current voltage by the power source 72 is applied between the first electrode layer 11 and the stripe electrode 16 via imaginary short of the operating amplifiers.

Meanwhile, in the event of retrieval, the switch 73 is connected to the first electrode layer 11 whereby the linear retrieving light L2 is exposed onto the stripe electrode 16 in the state that the first electrode layer and the stripe electrode 16 are short-circuited via the imaginary short of the operating amplifiers. Accordingly, the respective current detection amplifiers 71 simultaneously detect currents flowing on each of the connected elements 16a. Note that the constitutions of the current detection circuit 70 and the current detection amplifier 71 are not limited to the foregoing example, but various constitutions are applicable thereto.

In the following, description will be made regarding a method of recording image information on the radiation image recording medium 10 as an electrostatic latent image by use of the radiation image recording and retrieving apparatus of the above-described constitution, and a method of retrieving the recorded electrostatic latent image. First, description will be made regarding a process of recording the electrostatic latent image with reference to electric charge models shown in FIGS. 3A through 3C. Note that negative electric charges and positive electric charges generated inside the recording photoconductive layer 12 by the recording light L1 are illustrated with circled "−" signs or "+" signs in the accompanying drawings. In addition, illustration of the support of the radiation image recording medium 10 will be omitted in the figures.

Figure 3A:
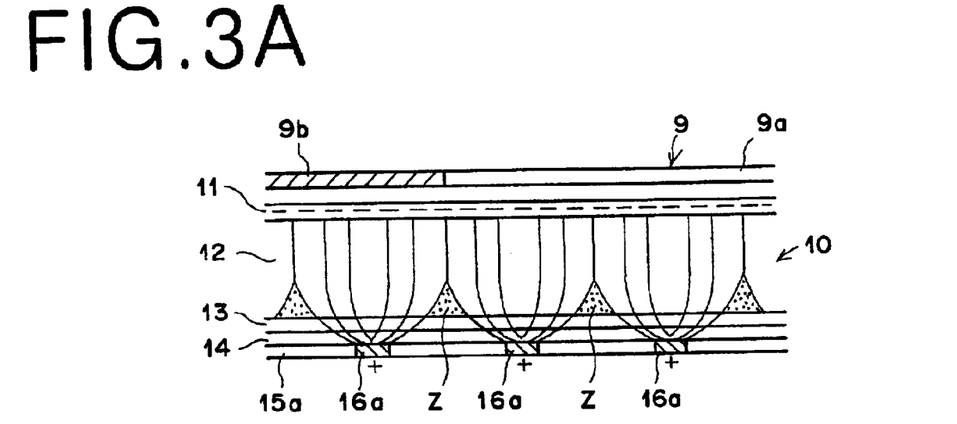
FIGS. 3A to 3C are views describing a method of recording an electrostatic latent image on the radiation image recording medium.

Upon recording the electrostatic latent image on the radiation image recording medium 10 in the radiation image recording and retrieving apparatus of the above-described constitution, first, the switch 73 is switched to the power source 72, and a direct-current voltage is applied between the first electrode layer 11 and the stripe electrode 16 to charge both. In this way, an substantially U-shaped electric field is formed between the first electrode layer 11 and the stripe electrode 16. Although substantially parallel electric fields exist in the majority of the recording photoconductive layer 12, there are also generated portions at an interface between the photoconductive layer 12 and the charge transport layer 13, i.e. the electric accumulator 19, where the electric field does not exist. Thereafter, electric field distribution is formed, in which the U-shaped electric fields are continuously arranged in the longitudinal direction of the elements 16a (FIG. 3A).

Figure 3B:
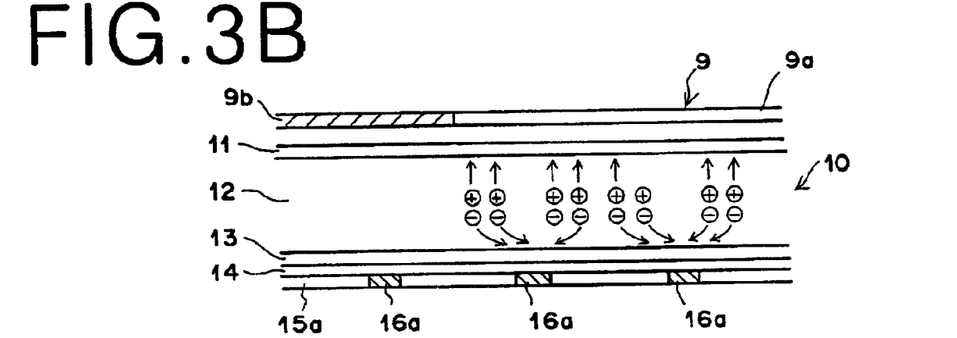
Figure 3C:
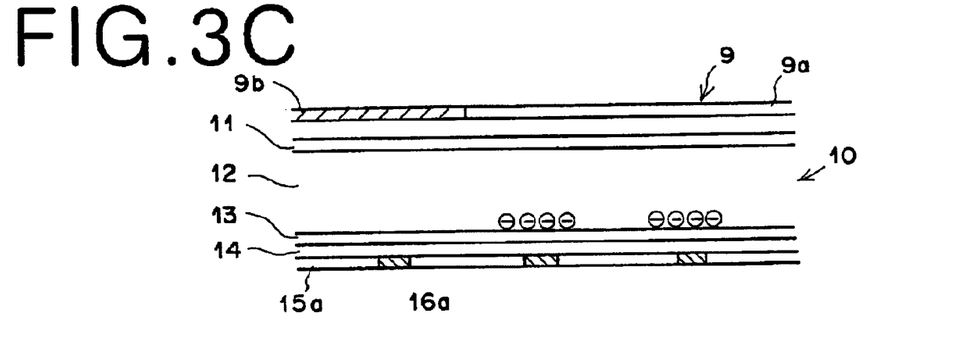

Next, radiation is irradiated onto the imaging object 9, and the recording light L1, which is transmitted through the transmissive portion 9a of the imaging object 9 and bearing the radiation image information of the imaging object 9, is irradiated onto the radiation-image recording medium 10. Then, positive and negative charge pairs are generated inside the recording photoconductive layer 12 of the radiation image recording medium 10. Of those charge pairs, the negative electric charges move toward the electric accumulator 19 along the above-described electric field distribution (FIG. 3B). On the contrary, the positive electric charges generated inside the recording photoconductive layer 12 rapidly move toward the first electrode layer 11 and are subsequently re-coupled with the negative electric charges injected from the power source 72 at an interface between the first electrode layer 11 and the recording photoconductive layer 12, whereby the positive electric charges eventually disappear. Meanwhile, since the recording light L1 is not transmitted through the light-shielding portion 9b of the imaging object 9, no changes occur in a portion of the radiation image recording medium 10 below the light-shielding portion 9b (FIGS. 3B and 3C).

In this way, it is possible to accumulate the electric charges relevant to the image of the imaging object in the electric accumulator 19, which is the interface between the recording photoconductive layer 12 and the charge transport layer 13 by irradiating the recording light L1 onto the imaging object 9. A quantity of the electric charges for a latent image (the negative electric charges) to be accumulated is substantially proportional to dosage of the radiation incident onto the radiation image recording medium 10 after passing through the imaging object 9. Accordingly, the electric charges for a latent image bear the electrostatic latent image, whereby the electrostatic latent image is recorded on the radiation image recording medium 10.

Figure 4:
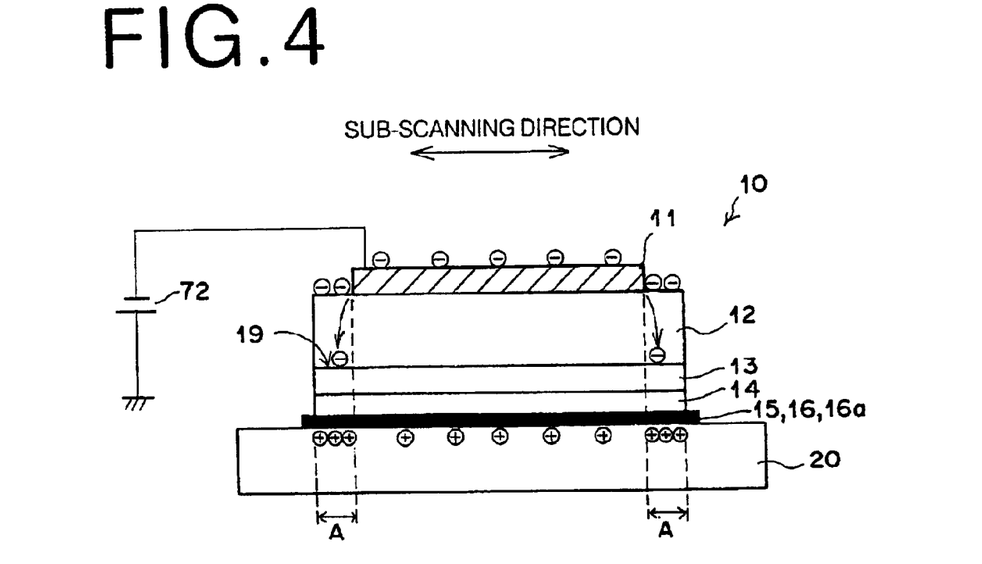
FIG. 4 is a view describing an influence of corona discharge on an end portion of a first electrode layer and injection of electric charges into a recording photoconductive layer.

Here, in the radiation image recording medium 10 used in the present embodiment, the size of the first electrode layer 11 is smaller than the size of the recording photoconductive layer 12. Accordingly, when the direct-current voltage is applied between the first electrode layer 11 and the second electrode layer 15 by the power source 72 in the foregoing recording process, corona discharge occurs at the end portions of the first electrode layer 11 as shown in FIG. 4, whereby the negative electric charges are charged in the vicinity of a surface of a peripheral portion of the recording photoconductive layer 12 at a surrounding portion of the first electrode layer 11. Moreover, at the end portions of the first electrode layer 11, electric charge injection occurs at the recording photoconductive layer 12 and the electric charges are accumulated in the electric accumulator 19. Positive electric charges are charged on non-imaging regions A of the second electrode layer 15 owing to the negative electric charges generated by the corona discharge and the negative electric charges accumulated in the electric accumulator 19 by the electric charge injection, whereby electric field distribution is formed. In other words, the electric field distribution is formed as if images exist in the non-imaging regions A which are not originally supposed to have such images. If retrieval is carried out in this state, a false image signal attributable to the foregoing electric field distribution is also retrieved. Since the false image signal is an extremely large signal, the false image signal affects the image signal to be retrieved out of the imaging region, thus constituting a cause for deterioration of an S/N ratio of the image signal. In addition, the foregoing false image signal attributable to the negative electric charges incurred by the corona discharge possesses an extremely long time constant, the false image signal possesses a large adverse influence on the image signal in the imaging region in particular.

Now, in order to solve the foregoing problem, description will be made regarding a process of retrieving an electrostatic latent image in the radiation image recording and retrieving apparatus of the present embodiment.

Upon retrieving the electrostatic latent image out of the radiation image recording medium 10, first the switch 73 is switched to the first electrode layer 11, whereby the first electrode layer 11 and the stripe electrode 16 are short-circuited via the imaginary short of the operating amplifiers 71a to re-arrange the electric charges. Subsequently, the radiation image recording medium 10 is scan-exposed with the linear retrieving light L2 by sub-scanning with the retrieving light irradiating means 93 in the longitudinal direction (the sub-scanning direction) of the elements 16a. Owing to the scanning exposure with the retrieving light L2, positive and negative charge pairs are generated inside the photoconductive layer 14 where the retrieving light L2 is made incident, corresponding to sub-scanning positions.

An extremely intense electric field (an intense electric field) is formed between the electric accumulator 19 and the stripe electrode 16. In addition, the charge transport layer 13 acts as a conductor with respect to the positive electric charges. Accordingly, the positive electric charges generated in the retrieving photoconductive layer 14 move rapidly across the charge transport layer 13 as if the positive electric charges are pulled by the electric charges of a latent image on the electric accumulator 19. Then, the positive electric charges are re-coupled with the electric charges for a latent image at the electric accumulator 19 and eventually disappear. Meanwhile, the negative electric charges generated in the retrieving photoconductive layer 14 are re-coupled with the positive electric charges at the first electrode layer 11 and the stripe electrode 16 and eventually disappear. Voltage variations between the first electrode layer 11 and the stripe electrode 16 attributable to the electric charge re-coupling are detected with the current detection amplifiers 71 as current variations. The electric currents flowing inside the radiation image recording medium 10 upon this retrieval correspond to the electric charges for a latent image, that is, to the electrostatic latent image. Accordingly, it is possible to retrieve the electrostatic latent image, in other words, to obtain the image signal representing the electrostatic latent image, by detecting the electric currents with the current detection amplifiers 71.

Here, if the retrieving light L2 is irradiated on the whole surface of the second electrode layer 15 upon the retrieval, then the charge pairs generated at the retrieving photoconductive layer 14 are re-coupled and thereby discharged due to the electric field distribution formed in the non-imaging regions in the event of recording, and such discharge is retrieved as the false image signal.

Figure 5:
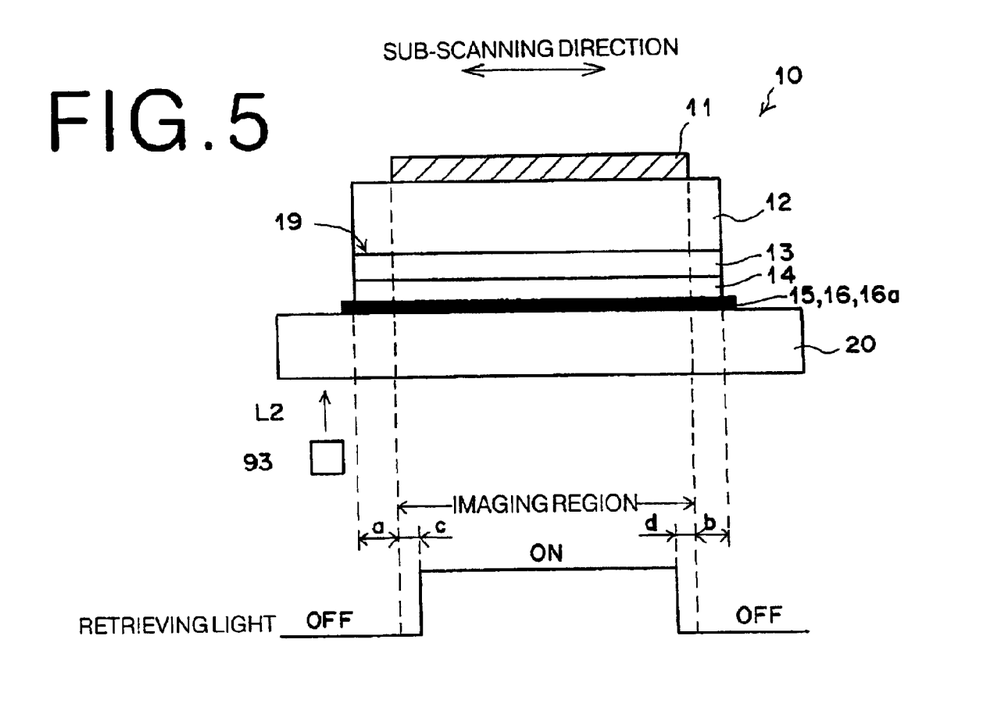
FIG. 5 is a view describing control of retrieving light to be irradiated onto the radiation image recording medium by the radiation image recording and retrieving apparatus shown in FIG. 1.

Therefore, in the present embodiment, the on and off state of the retrieving light irradiating means 90 is controlled so that the retrieving light L2 is not irradiated onto end regions a and b in the sub-scanning direction out of the non-imaging regions of the second electrode layer 15 as well as edge regions c and d of the imaging region adjacent to the end regions a and b as shown in FIG. 5. In order not to generate the false image signal, it may be deemed sufficient if the retrieving light irradiating means 93 is controlled not to irradiate the retrieving light L2 only on the foregoing non-imaging regions. However, in consideration of dispersion or diffraction of the retrieving light L2, it is still desirable that the retrieving light L2 is not irradiated onto the edge regions c and d of the imaging region as disclosed in the present embodiment. In addition, it is desirable that ranges of the edge portions c and d of the imaging region are set to regions within the imaging region where the image therein is less important or regions corresponding to margins of the image, for example.

Moreover, since it is due to generation of the false image signal caused by irradiation of the retrieving light L2 onto the end region a of the non-imaging region and the edge region c of the imaging region immediately before retrieving the imaging region that greatly affects the imaging signal. Accordingly, the retrieving light irradiating means 93 may be controlled not to irradiate the retrieving light L2 only onto these regions.

Moreover, if irradiation of the retrieving light L2 is controlled as described above, it is possible not to perform the retrieval at the end regions a and b of the non-imaging regions located at both ends in the sub-scanning direction out of the non-imaging regions of the second electrode layer 15, and at the edge regions c and d of the imaging region. However, the retrieving light L2 will be irradiated on end regions of the non-imaging regions located at both ends in the main scanning direction out of the non-imaging regions of the second electrode layer 15, and onto edge regions of the imaging region adjacent to these end regions. Nevertheless, it is needless to say that the retrieving light irradiating means 93 may be controlled not to irradiate the retrieving light L2 onto those regions as well.

According to the radiation image recording and retrieving apparatus of the present embodiment, the electromagnetic wave for retrieval is not irradiated onto the end regions a and b in the sub-scanning direction out of the non-imaging region of the retrieving photoconductive layer 14, which corresponds to the peripheral portion where the first electrode layer 11 is not provided on the upper surface of the recording photoconductive layer 12. Therefore, it is possible to avoid retrieval of the false image signal attributable to the corona discharge at the end portion of the first electrode layer 11 and electric charge injection from the end portion of the first electrode layer 11 into the recording photoconductive layer 12. In this way, it is possible to enhance image quality by preventing deterioration of the image signal relevant to the imaging region due to the false image signal.

Moreover, the electromagnetic wave for retrieval is not irradiated onto the edge regions c and d of the imaging region adjacent to the end regions a and b in the sub-scanning direction out of the non-imaging region where the electromagnetic wave for retrieval is not irradiated as well. Accordingly, it is possible to avoid an adverse influence by the false image signal more sufficiently.

Figure 6:
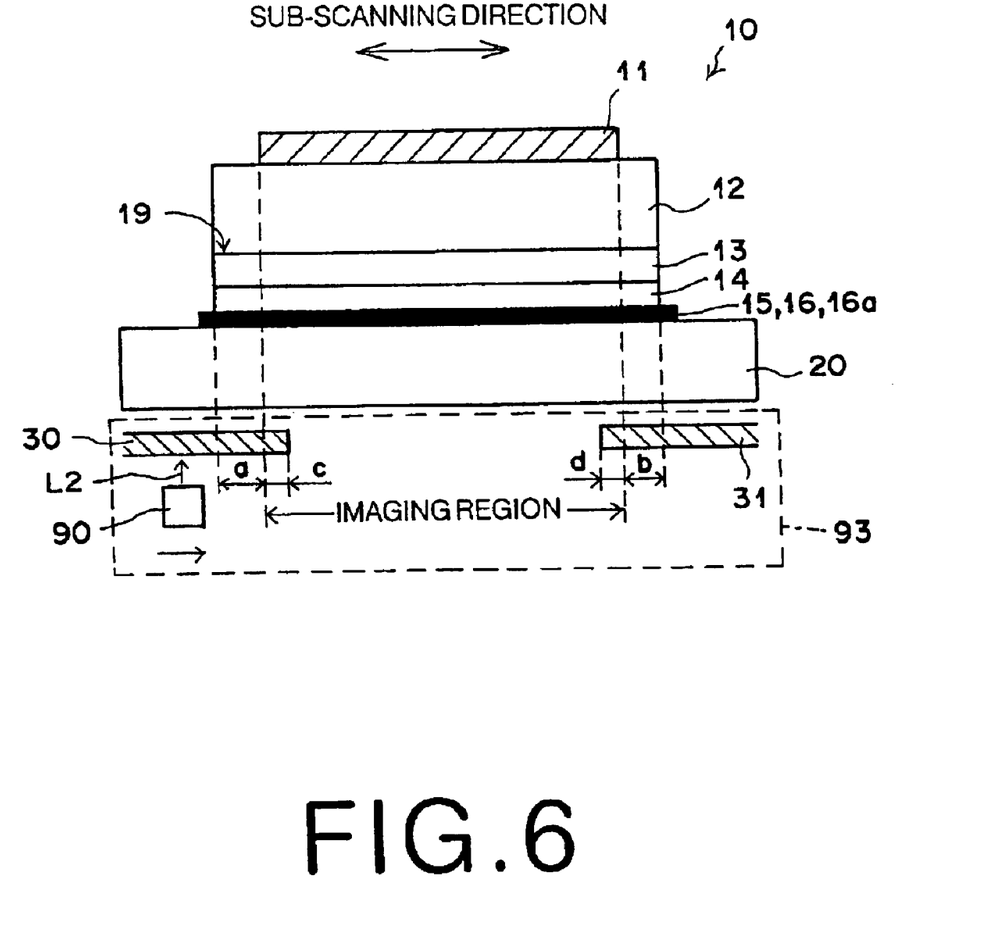
FIG. 6 is a schematic constitutional view of a radiation image recording and retrieving apparatus of another embodiment which adopts the image retrieving apparatus according to the present invention.

Although control of irradiation of the retrieving light L2 is performed by controlling the on and off state of the retrieving light irradiating means 93 in the above-described embodiment, it is also possible to provide predetermined light-shielding members 30 and 31 as shown in FIG. 6 instead, so that the retrieving light L2 is not irradiated onto the end regions a and b out of the non-imaging regions and onto the end regions c and d of the imaging region.

Figure 7A:
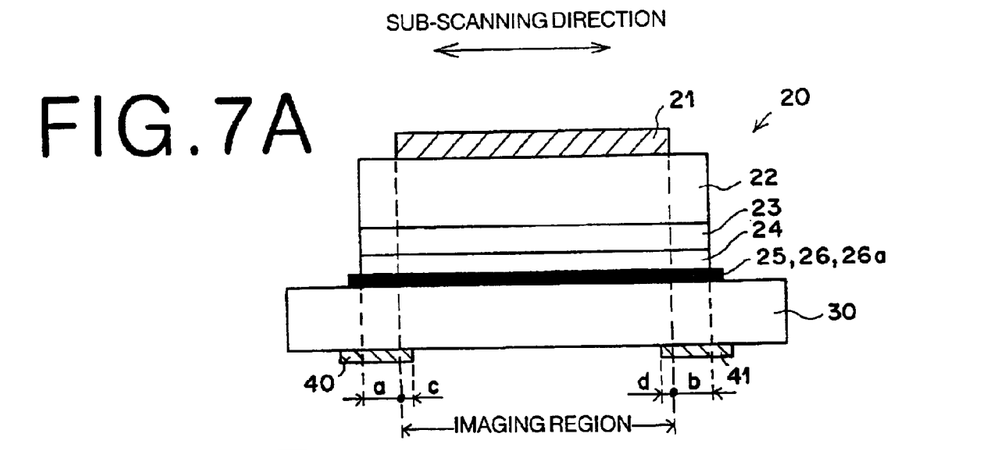
FIGS. 7A and 7B are schematic constitutional views of a radiation image recording medium adopting an image recording medium according to the present invention.
Figure 7B:
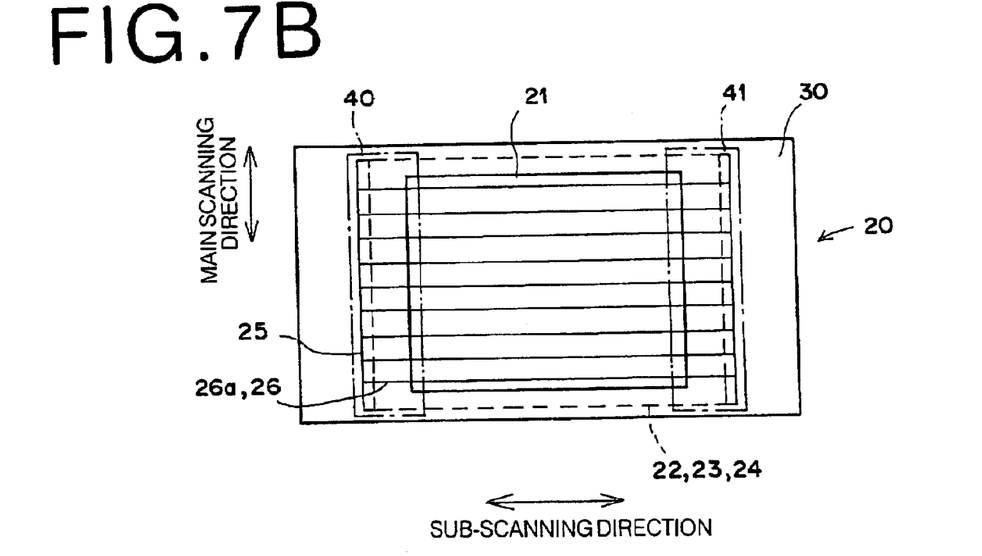

Next, description will be made regarding an alternate embodiment of a radiation image recording medium adopting an image recording medium according to the present invention by use of the accompanying drawings. FIGS. 7A and 7B illustrate a schematic constitution of the radiation image recording medium of the present embodiment. FIG. 7A is a cross-sectional view thereof and FIG. 7B is a plan view thereof.

A radiation image recording medium 20 of the present embodiment includes: a first electrode layer 21 which transmits an electromagnetic wave for recording such as radiation (recording light) L1; a recording photoconductive layer 22 which takes on conductivity by receiving irradiation of the recording light L1 transmitted through the first electrode layer 21; a charge transfer layer 23 acting substantially as an insulator with respect to electric charges for a latent image (negative electric charges, for example) and acting substantially as a conductor with respect to transported charges (positive electric charges according to the foregoing example) of the reverse polarity to the electric charges for a latent image; a retrieving photoconductive layer 24 which takes on conductivity by receiving irradiation of an electromagnetic wave for retrieval (retrieving light) L2; a second electrode layer 25 which transmits the retrieving light L2; and a support 30 which transmits the retrieving light L2. The radiation image recording medium 20 is formed by stacking the foregoing constituents in accordance with the above order of enumeration. In addition, light-shielding films 40 and 41 for shielding the retrieving light are provided partially on a surface of the support 30 where the retrieving light L2 is irradiated.

Materials and actions of the foregoing layers are similar to those of the radiation image recording medium 10 used in the previous embodiment. In addition, an organic polymer material such as polymethylmethacrylate (PMMA), for example, can be used for the support.

In the radiation image recording medium 20 of the embodiment, the second electrode layer is two-dimensionally irradiated by scanning with the retrieving light L2 in a main scanning direction and a sub-scanning direction, as similar to the radiation image recording medium used in the previous embodiment.

In addition, as shown in FIGS. 7A and 7B, the light-shielding films are provided to avoid irradiation of the retrieving light L2 onto end regions a and b located in the sub-scanning direction out of a non-imaging region of the second electrode layer 25 and edge regions c and d of an imaging region, as similar to the previous embodiment.

Any material such as black vinyl tape, Cr film, Al film or the like can be used for the light-shielding films 40 and 41, so far as the light-shielding films can shield the retrieving light L2.

In addition, as similar to the previous embodiment, ranges for provision of the light-shielding films are not limited to the ranges as illustrated in FIGS. 7A and 73. It is also possible to provide the light-shielding films on end regions located at both ends in the main scanning direction out of the non-imaging region of the second electrode layer 25 as well.

Moreover, in the embodiment, the light-shielding films 40 and 41 are provided on the surface of the support 30 where the retrieving light L2 is irradiated. However, without limitations to the foregoing, the light-shielding films 40 and 41 may be provided between the support 30 and the second electrode layer 25 or inside the support 30, for example. Otherwise, it is also possible to shield the light by coloring portions of the support 30 corresponding to ranges where the light-shielding layers 40 and 41 are supposed to be provided.

According to the radiation image recording medium of the embodiment, similar effects to the previous embodiment can be obtained by a simple constitution.

What is claimed is:

1. An image recording medium including a first electrode layer which transmits an electromagnetic wave for recording, a recording photoconductive layer which takes on conductivity by receiving irradiation of the electromagnetic wave for recording, an electric accumulator which accumulates electric charges for a latent image generated on the recording photoconductive layer, a retrieving photoconductive layer which takes on conductivity by receiving irradiation of an electromagnetic wave for retrieval, and a second electrode layer which transmits the electromagnetic wave for retrieval, the image recording medium being formed by stacking the foregoing constituents in accordance with the above order of enumeration, wherein a size of the first electrode layer is smaller than the recording photoconductive layer and the recording photoconductive layer thereby includes a peripheral portion on an upper surface thereof on which the first electrode layer is not provided, and a light-shielding film is provided for shielding irradiation of the electromagnetic wave for retrieval onto a non-imaging region of the retrieving photoconductive layer corresponding to the peripheral portion.

2. The image recording medium according to claim 1, wherein the electromagnetic wave for retrieval is irradiated onto the second electrode layer two-dimensionally by scanning in a main scanning direction and in a sub-scanning direction, and the light-shielding film shields at least one of end regions, which are located at both end portions of the non-imaging portion in the sub-scanning direction, from irradiation of the electromagnetic wave for retrieval.

3. The image recording medium according to either one of claims 1 and 2, wherein the light-shielding film also shields irradiation of the electromagnetic wave for retrieval onto an edge portion of an imaging region adjacent to the non-imaging region shielded from irradiation of the electromagnetic wave for retrieval.

4. An image retrieving method using an image recording medium, which includes a first electrode layer which transmits, an electromagnetic wave for recording, a recording photoconductive layer which takes on conductivity by receiving irradiation of the electromagnetic wave for recording, an electric accumulator which accumulates electric charges for a latent image generated on the recording photoconductive layer, a retrieving photoconductive layer which takes on conductivity by receiving irradiation of an electromagnetic wave for retrieval, and a second electrode layer which transmits the electromagnetic wave for retrieval, the image recording medium being formed by stacking the foregoing constituents in accordance with the above order of enumeration, the image retrieving method comprising the steps of:

irradiating the electromagnetic wave for retrieval two-dimensionally by scanning in a main scanning direction and in a sub-scanning direction with respect to the second electrode layer of the image recording medium in which the electric charges for a latent image are accumulated into the electric accumulator thereof by irradiation of the electromagnetic wave for recording; and obtaining an electric signal at a level corresponding to a quantity of the electric charges for a latent image which are accumulated in the electric accumulator by the irradiation;

wherein a size of the first electrode layer of the image recording medium is smaller than the recording photoconductive layer thereof and the recording photoconductive layer thereby includes a peripheral portion on an upper surface thereof on which the first electrode layer is not provided; and the electromagnetic wave for retrieval is not irradiated onto a non-imaging region of the second electrode layer corresponding to the peripheral portion.

5. The image retrieving method according to claim 4, wherein the electromagnetic wave for retrieval is not irradiated onto at least one of end regions located at both end portions of the non-imaging portion in the sub-scanning direction.

6. The image retrieving method according to either one of claims 4 and 5, wherein the electromagnetic wave for retrieval also is not irradiated onto an edge portion of an imaging region adjacent to the non-imaging region on which the electromagnetic wave for retrieval is not irradiated.

7. An image retrieving apparatus including an image recording medium, the image recording medium having a first electrode layer which transmits an electromagnetic wave for recording, a recording photoconductive layer which takes on conductivity by receiving irradiation of the electromagnetic wave for recording, an electric accumulator which accumulates electric charges for a latent image generated on the recording photoconductive layer, a retrieving photoconductive layer which takes on conductivity by receiving irradiation of an electromagnetic wave for retrieval, and a second electrode layer which transmits the electromagnetic wave for retrieval, the image recording medium being formed by stacking the foregoing constituents in accordance with the above order of enumeration, the image retrieving apparatus further comprising:

retrieving light irradiating means for irradiating an electromagnetic wave for retrieval two-dimensionally by scanning in a main scanning direction and in a sub-scanning direction with respect to the second electrode layer of the image recording medium in which the electric charges for a latent image are accumulated in the electronic accumulator thereof by irradiation of the electromagnetic wave for recording;

and image signal obtaining means for obtaining an electric signal at a level corresponding to a quantity of the electric charges for a latent image which are accumulated in the electric accumulator owing to irradiation of the electromagnetic wave for retrieval by the retrieving light irradiating means;

wherein a size of the first electrode layer of the image recording medium is smaller than the recording photoconductive layer thereof and the recording photoconductive layer thereby includes a peripheral portion on an upper surface thereof on which the first electrode layer is not provided; and the retrieving light irradiating means does not irradiate the electromagnetic wave for retrieval onto a non-imaging region of the second electrode layer corresponding to the peripheral portion.

8. The image retrieving apparatus according to claim 7, wherein the retrieving light irradiating means includes a light-shielding member for shielding the electromagnetic wave for retrieval, and the electromagnetic wave for retrieval is not irradiated onto the non-imaging region by use of the light-shielding member.

9. The image retrieving apparatus according to claim 7, wherein the retrieving light irradiating means does not irradiate the electromagnetic wave for retrieval onto at least one of end regions located at both end portions of the non-imaging portion in the sub-scanning direction.

10. The image retrieving apparatus according to claim 9, wherein the retrieving light irradiating means includes a light-shielding member for shielding the electromagnetic waver for retrieval, and the retrieving light irradiating means does not irradiate the electromagnetic wave for retrieval onto at least one of the end regions located at the both end portions of the non-imaging portion in the sub-scanning direction by use of the light-shielding member.

11. The image retrieving apparatus according to any one of claims 7 to 10, wherein the retrieving light irradiating means also does not irradiate the electromagnetic wave for retrieval onto an edge portion of an imaging region adjacent to the non-imaging region on which the electromagnetic wave for retrieval is not irradiated.

12. The image retrieving apparatus according to either one of claim 8 and claim 10, wherein the retrieving light irradiating means does not irradiate the electromagnetic wave for retrieval by use of the light-shielding member onto an edge portion of an imaging region adjacent to the non-imaging region on which the electromagnetic wave for retrieval is not irradiated by use of the light-shielding member.

* * * * *